(12) United States Patent
Alex et al.

(10) Patent No.: US 7,231,961 B2
(45) Date of Patent: Jun. 19, 2007

(54) LOW-PROFILE THERMOSYPHON-BASED COOLING SYSTEM FOR COMPUTERS AND OTHER ELECTRONIC DEVICES

(75) Inventors: Belits Alex, Denver, CO (US); Belits Valeriy, Highlands Ranch, CO (US)

(73) Assignee: Belits Computer systems, Inc., Centennial, CO (US)

( * ) Notice: Subject to any disclaimer, the term of this patent is extended or adjusted under 35 U.S.C. 154(b) by 111 days.

(21) Appl. No.: 11/087,402

(22) Filed: Mar. 23, 2005

(65) Prior Publication Data

US 2005/0217829 A1    Oct. 6, 2005

Related U.S. Application Data

(60) Provisional application No. 60/558,607, filed on Mar. 31, 2004.

(51) Int. Cl.
*F28F 7/00* (2006.01)
*H05K 7/20* (2006.01)
*H01L 23/34* (2006.01)

(52) U.S. Cl. ............................ 165/80.4; 165/104.33; 361/699

(58) Field of Classification Search ........... 165/104.33, 165/104.21, 108, 80.3–80.4, 687; 361/696–700, 361/702–704; 257/718–719
See application file for complete search history.

(56) References Cited

U.S. PATENT DOCUMENTS

| | | | |
|---|---|---|---|
| 5,587,880 A | 12/1996 | Phillips et al. | |
| 5,761,037 A | 6/1998 | Anderson et al. | |
| 5,940,270 A | 8/1999 | Puckett | |
| 5,953,930 A * | 9/1999 | Chu et al. | 62/259.2 |
| 6,388,882 B1 * | 5/2002 | Hoover et al. | 361/704 |
| 6,687,122 B2 * | 2/2004 | Monfarad | 361/687 |
| 6,840,311 B2 * | 1/2005 | Ghosh et al. | 165/104.33 |
| 6,981,543 B2 | 1/2006 | Chesser et al. | |
| 2001/0023757 A1 * | 9/2001 | Huang | 165/104.26 |
| 2001/0046119 A1 * | 11/2001 | Hamano et al. | 361/687 |
| 2002/0179284 A1 * | 12/2002 | Joshi et al. | 165/80.3 |
| 2003/0051859 A1 | 3/2003 | Chesser et al. | |
| 2005/0056403 A1 * | 3/2005 | Norlin et al. | 165/104.33 |

OTHER PUBLICATIONS

Beitelmal et al. (2002) "Two Phase Loop: Compact Thermosyphon," Hewlett-Packard Company Publication.
Joshi, Y. "Heat Out of Small Packages," http://www.memagazine.org/backissues/dec01/features/heatout.html.
Joshi et al. (2002) "Emerging Thermal Challenges in Electronics Driven by Performance, Reliability and Energy Efficiency," Georgia institute of technology, Microelectronics and emerging technologies thermal laboratory.

(Continued)

*Primary Examiner*—Tho Duong
(74) *Attorney, Agent, or Firm*—Greenlee Winner and Sullivan, PC (57) ABSTRACT

This invention provides a cooling system comprising a thermosyphon for computer and electronic devices. The thermosyphon comprises an evaporator placed on top of a heat source, such as CPU. Heat from the heat source causes liquid coolant inside the evaporator to evaporate or boil. The resulting vapor enters a condenser and returns to a liquid phase. Cooling fins are attached to the condenser to facilitate heat transfer with the surrounding airflow. The cooling system and computer or electronic device fit within standard computer cases and high density server rack-mountable cases.

20 Claims, 6 Drawing Sheets

OTHER PUBLICATIONS

Khrustalev, D. "Loop Thermosyphons for cooling of Electronics," http://www.thermacore.com/pdfs/thermosyphons.pdf.

Thermacore "Therma-Loop: Loop Heat Pipes and Loop Thermosyphons," http://www.thermacore.com/thermaloop.htm.

Thermacore "Mobile Processor Cooling with Remote Heat Exchanger," http://www.thermacore.com/therm_port.htm.

TS Heatronics Co. "new Heat Transfer Technology—Heatlane," http://tsheatronics.com.jp/english/technology/index.html.

Zuo et al. (2002) "Advanced Thermal Architecture for Cooling of High Power Electronics," *Thermacore*.

* cited by examiner

LOW-PROFILE THERMOSYPHON-BASED COOLING SYSTEM FOR COMPUTERS AND OTHER ELECTRONIC DEVICES

CROSS-REFERENCE TO RELATED APPLICATIONS

This application claims benefit of U.S. Provisional Application No. 60/558,607, filed Mar. 31, 2004, which is incorporated herein to the extent that there is no inconsistency with the present disclosure.

BACKGROUND OF THE INVENTION

Space in the data centers for servers and other computer systems is often limited. To conserve space, computer components are placed in close proximity. Cases which house servers and other computer systems are designed to take up as little space as possible. In particular, rack-mountable cases used with high density server racks are typically designed to be thin and flat in order to allow multiple servers or computer systems to be installed within the same server rack. As microprocessors and electronics become more powerful, it has proven difficult to provide cooling systems which can fit within the confined area of the cases and adequately cool the devices.

Modern computers and other electronic devices usually consume large amounts of energy, most of which is converted into heat. In particular, the power requirements of small servers are usually hundreds of watts. A large percentage of this energy is used by various chips and semiconductor devices, to power hard drive motors, fans, and other electromagnetic parts, and some of this energy is spent heating wires and producing electromagnetic waves that are usually blocked by the surrounding cases and shields. Only a very small amount of this energy leaves the computer as electric signals and light. Almost all energy that is consumed by a modern computer is ultimately converted into heat.

Out of those hundreds of watts, central processing units (CPUs) and other chips dissipate a large percentage. Modern CPUs dissipate 60–90W each, and the traditional rack-mountable case designs and server chassis designs often place 2 to 4 CPUs within a flat case approximately 17 inches wide and 1.75 inches high (the depth varies between 14 inches and 29 inches). CPUs have small dies, often less than 0.5 inches by 0.5 inches, and sometimes have built-in heat spreaders up to 1 inch×1 inch. Design requirements cause those chips to be placed on the same board within a few inches from each other, thus forming a small volume where a large amount of heat is produced (120–300W depending on the models and number of CPUs). The surfaces of the heat sources are a small fraction of a square inch, so the heat production is unevenly distributed within this already small volume.

The temperatures achieved on those chips have to be within an acceptable range, usually below 90° C. for CPUs, however some CPUs and many other chips are rated to only 65° C. Reliability requirements cause hardware designers to keep CPUs under 60–70° C. and other components below 40–50° C., even under the highest load possible (where highest load means a mode of operation with the highest power consumption, which usually means the highest rate of operations and highest number of gates involved). To achieve this, the heat should be removed at the same rate as it is being produced, and the temperature equilibrium between the chip under the highest load and the cooling system should be reached below those temperatures.

Heat produced within a case surrounded by cooler moving air will eventually pass to the outside air, so while removing the heat is simple, the problem is to keep heat-producing components, including CPUs, within the temperature limits suitable for their operation at all times. The most common solution for this problem is a large air-cooled heatsink placed on the top of the CPU die, sometimes with a separate heat spreader attached to the die as part of the CPU assembly with the heat sink placed on top. Tall fins or spikes protrude from the heatsink base, and a large amount of airflow is passed along those fins to remove the heat to the outside air. Traditional designs of this type of heatsink are commonly used in computers. The most common design is a copper or aluminum plate placed on the top of the CPU (for the purpose of this description the chips are assumed to be placed on the top side of a horizontal board, which is the standard layout in rack-mountable servers), with fins attached to the plate and a flat fan above the fins. The fan creates airflow through the fins toward the base plate and outside of the device into two or more directions. The base plate transfers the heat from the CPU to the fins, and the fins transfer the heat to the moving air.

The size of the heat sink is limited due to the limited heat conductivity of the base plate and fins. The temperature is highest at the center of the heatsink and decreases toward the edges and the top of the fins. When the heatsink size is increased, there is lower average temperature difference between the moving air and the fin surface, which causes less overall efficiency. Also a large heatsink can shield components under it from the airflow and expose surrounding components to hot air exiting the heatsink causing overheating of those components. This causes engineers to limit a heatsink's footprint and increase the airflow, often including large fans, blowers, ducts and shrouds in their designs. There are also designs incorporating heat pipes to distribute heat to the edge of the base plate or to the upper ⅔ of the fins.

Heat pipes typically include a sealed vessel with a vacuum formed inside. One end of a heat pipe (the evaporator) attaches to the surface of a heat source, and the other end of the heat pipe (the condenser) extends away from the heat source and is attached to a heat exchanger, heatsink, or exposed to cooler air. Heat pipes include a wick structure inside the vessel and a working fluid inserted in the vessel to saturate the wick structure. The atmosphere in the vessel is set such that, absent heat transfer, the fluid is maintained at a liquid-vapor equilibrium.

When a heat pipe is attached to a heat source, generated heat is transferred from the heat source to the evaporator of the heat pipe. The phase change of the fluid from liquid to vapor results in the absorption of a substantial amount of heat. This transfer of heat results in the generation of higher vapor pressure at the evaporator. The vapor pressure at the evaporator causes the vapor to flow in a direction toward the condenser. The lower temperature at the condenser causes the vapor to condense back to a liquid, thereby releasing its latent heat of vaporization to the condenser. The condensed fluid saturates the wick structure and gets pumped back to the evaporator of the heat pipe by capillary forces developed in the wick structure. This continuous cycle of vaporization-condensation allows heat pipes to transfer large quantities of heat with very low thermal gradients. Air-cooled heat pipes may also include a plurality of fins around the outside surface of the condenser to enhance heat dissipation from the condenser to the surrounding air, thereby keeping the walls of the condenser cooler and increasing the heat transfer performance of the heat pipe. Heatsinks that incorporate heat pipes usually have the evaporator ends of the pipes embedded in the base plate, and the condenser ends of the same pipes either have cooling fins on the surface, or are attached to the upper section of fins that have their lower end attached to the base plate, thus distributing the heat evenly over the length of the fin.

While these designs improve the performance of the heatsinks, they increase the necessary thickness of the base plate and often require complex manufacturing procedures to ensure the efficient heat transfer to and from the heat pipes.

Flat 1.75-inch high cases that are often used for high-density servers cause additional problems for traditional heatsinks. The height of the fins is limited by the space remaining in the case above the CPU. Even if the fan is moved from above the heatsink to the side, thus leaving more space for cooling fins, the height of the fins will be less than what is commonly used in traditional heatsinks. Air ducts passing through the heatsinks can isolate the airflow and increase the efficiency, however, they have to be routed around other components, which often limits their cross-section and causes additional resistance to the airflow. As a result, larger and more powerful fans and blowers are required.

Moving the heat to a heatsink located outside of the circuit board's footprint can solve some of these problems, but traditional heat pipes have to be large enough to pass liquid over their wick to achieve the necessary efficiency. The space within a case is often limited, and CPUs are often surrounded by other tall components, in particular capacitors of their own power supply circuits and connectors for various boards and cables. Heat pipe-based cooling systems are used for small laptop computers, where the cooling requirements are less, or in larger desktop cases, where extra space is available. Heat pipe-based cooling systems small enough to fit within smaller cases, such as cases used with high density servers, do not efficiently transfer heat from CPUs with higher power requirements.

A thermosyphon is a heat pipe that lacks a wick or a wick-like structure, although a wick may be used to support evaporation of the liquid coolant. A thermosyphon relies on gravity to return condensed coolant back to the evaporator instead of the capillary effect in a wick, which relies on surface tension. Using a thermosyphon simplifies the device and allows faster coolant flow, however it has an obvious disadvantage of requiring a certain location of the evaporator and condenser relative to the direction of the force of gravity. Thermosyphons will not work if the evaporator is placed above the condenser.

Thermosyphons often have large evaporators where a nearly constant level of the liquid coolant is maintained. Evaporators have flat, smooth bottoms, or have some porous material or structures completely submerged in the liquid, to assist the evaporation. Evaporators are connected to a condenser by a pipe, or by separate pipes for the liquid coolant and the vapor (known as loop thermosyphons). Although thermosyphons are well known in the art, they are not easily adaptable for use in small scale electronics.

Thermocore International Inc. (780 Eden Road, Lancaster, Pa. 17601) provides loop thermosyphons and heat pipes for thermal control in avionics and high power electronics. However, the length of these devices ranges from approximately 0.6 meters to 2 meters (see http://www.thermacore.com/thermaloop.htm). An additional device is a square U-tube loop thermosyphon having a long U-shaped evaporator spanning multiple heat sources, and a condenser placed 15 cm to 150 cm above the evaporator (Khrustalev, Dmitry, "Loop Thermosyphons for Cooling of Electronics," available at http://www.thermacore.com/pdfs/Thermosyphons.pdf). Khrustalev also discloses a loop thermosyphon having horizontal transport lines and a large condenser with a plurality of vertical cooling fins attached to the top of the condenser (Khrustalev, Dmitry, "Loop Thermosyphons for Cooling of Electronics"). Such devices are clearly unsuitable for the limited space associated with current rack-mountable cases, which are only approximately 1.75 inches (4.4 cm) high, unless the condenser and pipes are placed outside of the case.

Beitelmal and Chandrakant, (Jan. 2002 "Two Phase Loop: Compact Thermosyphon," Hewlett-Packard Company publication) describe a loop thermosyphon used to cool a HP Vectra VL800 desktop computer having a 1.5 GHz Pentium-4 processor. The thermosyphon described by Beitelmal and Chandrakant has a condenser that is 8.2 cm wide, 7.5 cm high and 2.6 cm deep, and an evaporator that is 3.2 cm wide, 2.9 cm high and 3.2 cm deep. Although these dimensions are adequate for a desktop computer, the condenser alone would not fit within standard rack-mountable cases. In addition, because the thermosyphon relies on gravity to transport the coolant, the condenser is placed higher than the evaporator, thereby further increasing the height of entire thermosyphon device.

There are other various designs and experimental devices based on thermosyphons, some as simple as a single vapor cavity within a heatsink base, some as complex and elaborate as "thermal buses" and multi-stage thermosyphons. None of these designs are now in common use because of their unacceptable size, complexity and cost. The main problem is the failure of the device to fit entirely into the geometry of the standard rack-mountable case while maintaining adequate cooling abilities. The modularity requirements that allow users to mix various devices in the same rack, and the cost of space in data centers prevent large external cooling devices from being used in such environment, and the needs of companies that use large numbers of identical servers in flexibly-organized space do not create enough demand for those solutions to be viable.

What is needed is a more efficient and simple cooling system for small scale computer systems and electronics that fit within today's space requirements, especially space requirements present in typical rack-mountable server cases.

SUMMARY OF THE INVENTION

The cooling system of the present invention comprises a thermosyphon device able to provide cooling to a computer or electronic device and still fit within a standard computer case or rack-mountable case. The dimensions of typical rack-mountable cases range from approximately 17–19 inches wide, 1.7–1.75 inches high and 14–29 inches deep. For example, the Antec (1U26ATX250) ATX rack-mountable case is 17.02 inches wide, 26 inches deep, and 1.73 inches high. The Intel 1U 350W (sr1350ena) rack-mount chassis and the SuperMicro CSE-512L ATX case are both 16.7 inches wide, 14 inches deep, and 1.7 inches high.

A thermosyphon cooling device of the present invention is a sealed device with a vacuum formed inside. The thermosyphon device comprises an evaporator; a narrow condenser; a liquid coolant within said evaporator and condenser; at least one coolant pipe connecting said evaporator to said condenser, wherein said at least one coolant pipe is at or below the level of said liquid coolant; and at least one vapor pipe connecting said evaporator with said condenser, wherein said at least one vapor pipe is above the level of said liquid coolant. The pressure in the vessel is set such that, absent heat transfer, the coolant is maintained at a liquid-vapor equilibrium. The evaporator and condenser are separate hollow chambers connected by the coolant pipes and vapor pipes, which allow the liquid coolant to freely flow from the condenser to the evaporator, and the vapor to flow from the evaporator to the condenser. The thermosyphon device also optionally comprises one or more vertical evaporator fins within the evaporator, wherein the vertical fins are attached to the bottom of said evaporator and extend to or above the surface of said liquid coolant.

Typically, the condensers of thermosyphons are placed over or higher than the evaporators to utilize gravity to force the liquid from the condenser to the evaporator. This placement is not possible in spaces where the available height is severely limited. Although part of the condenser may be higher than the evaporator, or vice versa, the condenser and evaporator are approximately horizontal to each other in the present invention.

The thermosyphon device also optionally comprises a plurality of cooling fins attached to the outer surface of at least one side of the condenser and extending laterally from said condenser. In spaces where the available height is severely limited, cooling fins do not have enough space to extend above the condenser. The only available space for the cooling fins is to the sides of the condenser. A fan or blower forces cooler air from outside of the case through the cooling fins. In one embodiment, the cooling fins have a rectangular shape, but can be any shape that provides sufficient surface area with the moving air. The cooling fins extend from the condenser in a horizontal plane or are orientated at an angle between horizontal and vertical.

The evaporator is placed on top of a heat source, which is any heat-producing chip or component used in a computer or circuit board, such as a CPU. One or more coolant pipes connecting the evaporator and condenser are placed horizontally, or at a small angle from horizontal, at or below the coolant level within the evaporator and condenser. By "at or below the coolant level" it is meant that the one or more coolant pipes are filled completely or incompletely with the liquid coolant, and that the liquid coolant can flow from the condenser to the evaporator. One or more vapor pipes connecting the evaporator and condenser are placed horizontally, or at an angle, above the coolant level and are filled with vapor.

Heat generated by the heat source is removed through the boiling and/or evaporation of the liquid coolant and transferal of the resulting vapor into the condenser. Airflow past the outer walls of the condenser or cooling fins attached to the condenser lowers the temperature of the condenser causing the vapor to condense. The condensed liquid flows from the bottom of the condenser through the cooling pipe back into the evaporator.

The evaporator is a hollow chamber with a flat heat-conducting bottom, sides and a cover. The shape of the evaporator can be approximately rectangular, cubical, or can have a dome-like shape. The sides and the cover may be made as a single dome-like structure, or the bottom and sides, and possibly the cover, can be made as one piece. The coolant pipes connecting the evaporator and condenser are connected to the sides of the evaporator at or near the bottom of the evaporator. The vapor pipes are connected to the cover of the evaporator or to the sides of the evaporator at or near the top of the evaporator.

The condenser is a narrow, long chamber having two opposing long sides placed at a small distance from each other, forming a narrow channel within the inside of the condenser. The shape of the condenser can be approximately rectangular or cylindrical. As used herein, the length of the condenser refers to the two opposing long sides, and the width refers to the two opposing short sides. In the present invention, the condenser has a length significantly greater than its width. In one embodiment, the length of the condenser is at least ten times greater than the width of the condenser. In another embodiment, the length of the condenser is at least twenty times greater than the width of the condenser. In yet another embodiment, the length of the condenser is at least thirty times greater than the width of the condenser. In one embodiment, the height of the condenser is at least twice as great as the width, more preferably the height is at least five times greater than the width.

The pipes connecting the evaporator and condenser are attached to one of the long sides of the condenser, either near the middle or near one of the ends of the condenser. The coolant pipes are connected to the sides of the condenser at or near the bottom of the condenser, and the vapor pipes are connected to the sides of the condenser at or near the top of the condenser. When used for cooling computer components, the routing of the pipes between the evaporator and condenser is determined by the space available inside the computer case. The coolant pipes are routed around capacitors, coils, small chips' heatsinks, power and fan connectors and RAM sockets. The vapor pipes can go above most of the devices except the RAM, power connectors and other tall parts. The shape of the pipes should not affect the efficiency of the cooling device as long as the coolant pipes allow the liquid coolant to flow unimpeded, and the vapor pipes do not drop below the level of the liquid. The device is easier to install and less affected by tipping when the length of the pipes is shorter.

The long sides of the condenser provide sufficient inside area for condensation to take place. The pressure difference formed when the vapor condenses causes the vapor to flow to the sides of the condenser. The vapor pipes can be connected anywhere along the sides of the condenser with little effect on the heat transfer efficiency. The rate of vapor flow depends on the rate of condensation, which in turn depends on the difference in temperature between the vapor and the sides of the condenser. The temperature of the vapor will be nearly constant within the cooling device over its volume because the vapor is saturated, and its pressure does not significantly vary between parts of the device, so the temperature corresponds to the pressure of the saturated vapor that is approximately constant. The temperature of the sides of the condenser depends on the heat exchange with the outside coolant, which may be air, water, or another cooling system. The diameter of the vapor pipes should be sufficient for vapor flow.

The liquid flow within the condenser is provided by gravity and impeded by friction, viscosity and surface tension. The inner sides of the condenser should be smooth or have vertical grooves that allow drops of condensed coolant to flow toward the bottom of the condenser without reaching large enough drop size to cover the sides and decrease the efficiency of condensation. The distance between the sides should be sufficient to support the liquid flow toward the coolant pipes without significantly raising the liquid level due to the capillary effect and flow resistance (raising the liquid level decreases the available area for condensation, and provides less efficient heat exchange with the liquid), or allowing the drops formed on the opposite walls to combine. As long as there is some amount of liquid at the bottom flowing toward the coolant pipes, preferably flooding them completely so vapor bubbles do not form, and the liquid flow to the evaporator supports the rate of boiling and/or evaporation, the device is operating properly.

The evaporator maintains the rate of boiling and/or evaporation to match the heat production by the CPU. The level of liquid coolant within the evaporator can change without significantly affecting the performance of the device as long as there is some level of liquid coolant remaining in the evaporator. To achieve the low CPU temperature, there must be low thermal resistance between the bottom of the evaporator and the area where the liquid coolant is evaporating or boiling. If the evaporator is implemented as a simple box containing liquid coolant, the thermal resistance will be high.

In one embodiment of the present invention, where the evaporator was implemented as a simple box, the system was filled with acetone and boiling only occurred on the surface of the acetone in a small area. Colder liquid arriving from the condenser through the coolant pipes and convection within the evaporator distributed the heat evenly through the most of the liquid acetone. The lower layers of the acetone were prevented from heating to temperatures higher than the upper layers of the liquid even though the bottom of the evaporator, being closer to the heat source, had a higher temperature and would boil the liquid acetone if the heat exchange with the liquid acetone was more efficient. Acetone only boiled at the surface, where hydrostatic pressure was slightly lower, and along the sides of the evaporator, where the heat was transferred from the metal. This reduced the boiling area to a small rim at the surface of the liquid acetone. The temperature difference between the boiling layer and the bottom of the evaporator was determined almost entirely by the heat transfer through the evaporator's material. The resulting temperature difference between the CPU and the vapor became unacceptably high.

To counter this effect, evaporator fins are attached to the bottom of the evaporator forming additional surfaces reaching and crossing the surface of the liquid. The evaporator fins transfer the heat upward from the bottom of the evaporator and provide surfaces to form bubbles during boiling. The transfer of the heat to the surface of the liquid coolant through the evaporator fins also improves the evaporation in situations when no boiling occurs and all evaporation is performed on the surface of the liquid without bubbles being formed. This reduces the temperature difference between the bottom of the evaporator and the vapor, and continues working when the level of the liquid coolant changes, thus ensuring the stability of the process. This approach is different from completely submerged devices described in the prior art used in other types of evaporators to facilitate boiling below the surface.

The space in the evaporator above the liquid does not affect the evaporator's efficiency as long as the liquid coolant does not flood the vapor pipes. The location, shape and the number of vapor pipes provide sufficient total cross-section for the vapor to reach the condenser without dissipating enough heat to cause the vapor to condense inside the pipes, which would slow down the vapor and possibly heat the air that is supposed to cool other parts of the computer. Adding a thin layer of thermal insulation around the vapor pipes can prevent heat dissipation. Placing the vapor pipes at an angle between horizontal and vertical, where the condenser end is higher than the evaporator end, also helps to remove condensed liquid from vapor pipes and can direct any condensed liquid to empty back into the evaporator.

When the device is used with air cooling, such as with a fan or a blower, one or both of the long sides of the condenser can be used to transfer the heat to the moving air. In a flat 1.75 inch high computer case, where there is not room for fans in the top or bottom of the case to deliver vertical air flow, the air travels horizontally along the outer surface of the condenser's long sides. The outer surface of the long sides of the condenser may contain a plurality of cooling fins to increase heat transfer to the moving air. Most of the heat is transferred to the condenser walls when the vapor from the evaporator is condensed. The pressure and temperature of the coolant is nearly constant over the whole area of the heat-transferring wall. As a result, the direction of the vapor flow inside the condenser does not significantly affect the temperature distribution over the heat-dissipating outer surface. There is no need to provide air flow in the direction opposite to the coolant flow as is necessary in a traditional heat exchanger where the coolant does not change its phase while transferring heat to the moving air.

In one embodiment of the invention, a sufficient amount of space is allocated along one of the side walls of a computer case to form a narrow passage from the front to the back of the case. The condenser is placed along this passage, and air movement is created through the passage by 1 or 2 fans or blowers. If traditional heatsink fins were used in this design, the cold incoming air will efficiently cool the condenser's wall at one end, but the temperature of the air will increase as the air travels along the condenser. As a result, the temperature difference between the air and the condenser will decrease, reducing the efficiency of the air to cool the device. Additionally, large cooling fins create large amount of friction and resistance to the airflow, thus reducing the air speed and heat transfer efficiency or requiring a more powerful fan that may not fit into the available space.

The optimal heat transfer with the present device will happen when the air temperature is constant over the surface of the sides of the condenser, which is best achieved by blowing air at the sides horizontally at a right angle and letting the air exit vertically upwards and downwards. This is rarely possible in 1.75 inch high rack-mountable cases because usually the top, bottom and sides of the case are blocked by the rack or other devices, and only the front and back panels have vents. In an embodiment of the present invention, the airflow within a case is horizontal and is directed to travel roughly parallel along at least one of the long sides of the condenser. To increase the efficiency of heat transfer with the air, the cooling fins are placed at an angle from horizontal and do not cover the whole area of the condenser's walls, leaving wedge-shaped air "intake" and "exhaust" gaps below and above the fins. The wedge-shaped gaps are sections on the side of the condenser that are not covered by cooling fins. All of the fins may be placed to form a uniform structure, or the fins may be placed in groups forming steps. In either case, the colder air enters and exits the space between the fins in multiple areas along the condenser, thus creating more even temperature distribution than what would happen if the fins were uniformly horizontal or extended the whole length of the condenser.

In embodiments where a case contains only one heat source that is cooled by the present device, cooling fins can be placed on both of the long sides of the condenser. In embodiments where two or more heat sources are cooled by the present device, it is often necessary to conserve space and reduce the resistance to the airflow. One embodiment of the invention comprises two thermosyphon devices where the condensers are arranged parallel to each other with one of the long sides of each condenser facing the other. Cooling fins are placed on the sides of the condensers facing each other and the airflow is directed between the condensers.

The exact configuration of the cooling fins should be based on the requirements for airflow, efficiency of the fins of different height, and the available amount of surface area on the condensers. Coolant and vapor pipes can be routed around various components, and the number of the pipes should be determined by the requirements for coolant and vapor flow. Different configurations are available when multiple heat sources are present, with separate sets of evaporators and condensers placed in pairs or blocks. Multiple evaporators as well as multiple condensers may be connected in parallel. Parallel systems will have vapor and coolant pipes connecting the top and bottom of multiple devices in various sequences. Multiple condensers may be attached to the same evaporator(s) for when very large amounts of heat are produced, or when airflow is only available in lower amounts.

Preferably rack-mountable cases used with the present invention are placed horizontally in a rack, however, racks are not necessarily placed precisely horizontally, and technicians often have to move equipment and place the case on a desk or cart. The evaporator and condenser tolerate changes in the level of the liquid coolant inherent during boiling and/or evaporation and condensation, and can recover from momentary flooding of the vapor pipes or drying of the bottom of the evaporator or coolant pipes. Additionally, it is an advantage of this invention that its cooling properties are not significantly changed when the device is tilted at a small angle. The evaporator fins provide stability by presenting a surface for efficient heat transfer to the liquid coolant along their entire height, regardless of the changes in the level of the liquid. Additionally, when the device is tilted toward the condenser gravity will cause the liquid coolant to flow toward the condenser; however, less volume is required to raise the level of liquid coolant in the condenser due to the small width of the condenser relative to the other dimensions of the condenser and evaporator. This will increase the likelihood that the coolant pipes will remain at or below the level of the coolant in the condenser, allowing the liquid coolant to continue to flow to the evaporator. The length of the condenser, which is larger relative to the other dimensions of the condenser, provides a large surface area for heat distribution. The condenser continues to operate as long as there is enough space above the level of the liquid to allow vapor to condense on the sides of the condenser.

Usually heatsinks and other cooling devices are attached to CPUs and other heat sources using brackets and clips. A cooling device of the present invention should use a strong bracket to attach the evaporator to the heat source. The bracket should not induce bending forces that are higher than ones produced by traditional heatsinks. Also the bracket should avoid application of uneven pressure, tilting or application of the whole force to only one edge of the chip while the device is being installed. To accomplish this goal, a special bracket and locking spring is used. A reverse U-shaped bracket is attached to the computer case, board, standoffs or a socket just like any standard heatsink bracket. However the bracket should be taller than usual and cover the whole evaporator, leaving space between the top of the evaporator and a bracket to fit a vaguely S-shaped spring. The S-shaped spring should contact the evaporator or the evaporator's cover plate in the center directly above the center of the chip. When installed, the spring is rotated and bends until it latches with the bracket, keeping the device secure. To remove the evaporator the ends of the spring are pressed, releasing the latched ends, and the S-shaped spring is rotated back until it releases the evaporator. This mechanism ensures that force is always applied to the center of the evaporator and is directed downwards, toward the center of the chip. This prevents the damage to the chip or scratching of the evaporator, and allows the user to achieve good thermal contact even if installation is performed in a cramped environment that is common in data centers. The same bracket and S-spring mechanism can be used for other applications, such as attaching regular heatsinks that do not require an open top.

DETAILED DESCRIPTION

High-density servers are placed in rack-mountable cases approximately 17 inches to 19 inches wide and 1.75 inches high, or less, when laid flat. All devices, including cooling devices, within the case must fit within these dimensions. The height of the floor of the case, standoffs, circuit board, CPU socket and CPU itself leaves only about 1 inch between the surface of the CPU and the top of the case, so any evaporator or heatsink attached to top of the CPU or other heat source should not exceed 1 inch in height. A thermosyphon device within a case such as this will need to work with a very small amount of hydrostatic pressure moving the liquid. The load on the CPU, and therefore the heat production, may vary over the time, and the case is not necessarily placed precisely horizontally, so the design of the thermosyphon device should be suitable for varying conditions, including changes in the amount of heat produced by the CPU, level of liquid, and vapor bubbles in pipes. Heat can be passed to a heat exchanger inside the case yet outside the circuit board's footprint, or at least outside the footprint of the large parts protruding from the board, to the moving air.

One embodiment of the thermosyphon device of the present invention cools a computer or electronic device within a case that is 17–19 inches wide, or less, and has a height of 2 inches or less. In another embodiment of the present invention, the thermosyphon device cools a computer or electronic device having multiple heat sources in a case that is 17–19 inches wide, or less, and 2 inches in height, or less. In one embodiment, the height of the thermosyphon device does not exceed 2.0 inches. In another embodiment, the height of the thermosyphon device does not exceed 1.75 inches. In another embodiment, the height of the thermosyphon device does not exceed 1.7 inches. In yet another embodiment, the height of the thermosyphon device does not exceed 1.5 inches.

Components of the thermosyphon devices of the present invention are made from materials that are strong, durable and have the necessary heat-conductive properties. In one embodiment of the present invention, the heat-conducting surfaces and evaporator fins are made out of copper. The top of the evaporator and the non-heat-conducting surfaces of the condenser are also made out of copper but can be made from other materials, such as brass or aluminum, that can be attached to copper parts by soldering, brazing, precision molding or welding. The cooling fins attached to the condenser are made from copper but can be made from aluminum as long as there is good thermal contact with the condenser. The coolant and vapor pipes are also made from copper but can be made from other materials that remain stable in the conditions the pipes are exposed to.

In one embodiment of the present invention, the liquid coolant is acetone. In another embodiment, other liquids with similar boiling points to acetone, such as ethanol and methanol, are used. In another embodiment, the liquid coolant is water.

The dimensions of the thermosyphon cooling device of the present invention are large enough to provide cooling to a computer or electronic device, but small enough so that both the thermosyphon device and the computer or electronic components fit within the case. In one embodiment, the present invention provides cooling to a computer or electronic device having one or more heat sources within a rack-mountable case that is 19 inches wide, or less, with a case height below 2 inches.

One embodiment of the present invention is a computer system or electronic device comprising: a case, wherein said case has a width of about 17 inches or less, a height of 1.75 inches or less, and length of 28 inches or less; at least one heat source within said case, such as a CPU; and at least one thermosyphon device within said case, said thermosyphon device comprising: (i) an evaporator; (ii) a narrow condenser having a first and second long side, and a first and second short side, wherein said first and second long sides are parallel and opposite to each other, and said first and second short sides are parallel and opposite to each other; (iii) a liquid coolant within said evaporator and condenser; (iv) at least one coolant pipe connecting said evaporator to said condenser, wherein said at least one coolant pipe is at or below the level of said liquid coolant; and (v) at least one vapor pipe connecting said evaporator with said condenser, wherein said at least one vapor pipe is above the level of said liquid coolant. The at least one thermosyphon device optionally comprises a plurality of cooling fins attached to said first long side, said second long side, or both, wherein said cooling fins extend laterally from said condenser. The thermosyphon device optionally comprises one or more vertical evaporator fins within said evaporator, wherein said one or more evaporator fins are attached to the bottom of said evaporator and extend to or above the surface of said liquid coolant One embodiment of the invention comprises a thermosyphon device comprising a condenser which is about 5 inches to about 13 inches long, preferably about 6 inches to about 10 inches long, and about 0.20 inches to about 0.5 inches wide (not including the dimensions of the cooling fins). The height of the condenser can be any height within the available height within the case, and will range from about 1.0 inches to about 1.7 inches. The shape and size of the cooling fins can be designed so that they fit within the available space while providing efficient heat transfer with the airflow. Typically the height of the cooling fins will not exceed the height of the condenser, and the cooling fins will laterally extend between about 0.5 inches to about 1.0 inches from the side of the condenser. Evaporators can be any size that allows the liquid coolant to evaporate or boil due to heat transfer from the heat source, although a larger evaporator base will help prevent flooding of the evaporator if the device is tilted. In one embodiment, evaporators are about 1.0 inch to about 2.0 inches long, about 1.0 inch to about 2.0 inches wide, and about 0.50 inches to about 1 inch high. The vapor and coolant pipes are between about 0.5 inches to about 5.50 inches long with an outer diameter between about 0.15 inches to about 0.50 inches.

In one embodiment of the present invention, the dimensions of the condensers are between about 8.0 and about 10.0 inches long, between about 0.2 and about 0.25 inches wide, and between about 1.4 inches and about 1.5 inches high. The evaporator is between about 1.8 inches and about 2.0 inches long, between about 1.8 inches and about 2.0 inches wide, and between about 0.7 and 0.8 inches high. The vapor and coolant pipes are between about 1.30 inches long and about 4.70 inches long with an outer diameter of about 0.25 inches. In a further embodiment, the condenser is 8.27 inches long, 1.46 inches high and 0.24 inches wide. The cooling fins extend and additional 0.66 inches from at least one of the long sides of the condenser. In another embodiment, the dimensions of the condensers are 9.84 inches long, 1.46 inches high and 0.24 inches wide, with the cooling fins extending an additional 0.66 inches from the side of the condenser. In one embodiment, evaporators are 1.97 inches long, 1.97 inches wide and 0.75 inches high.

Figure 1:
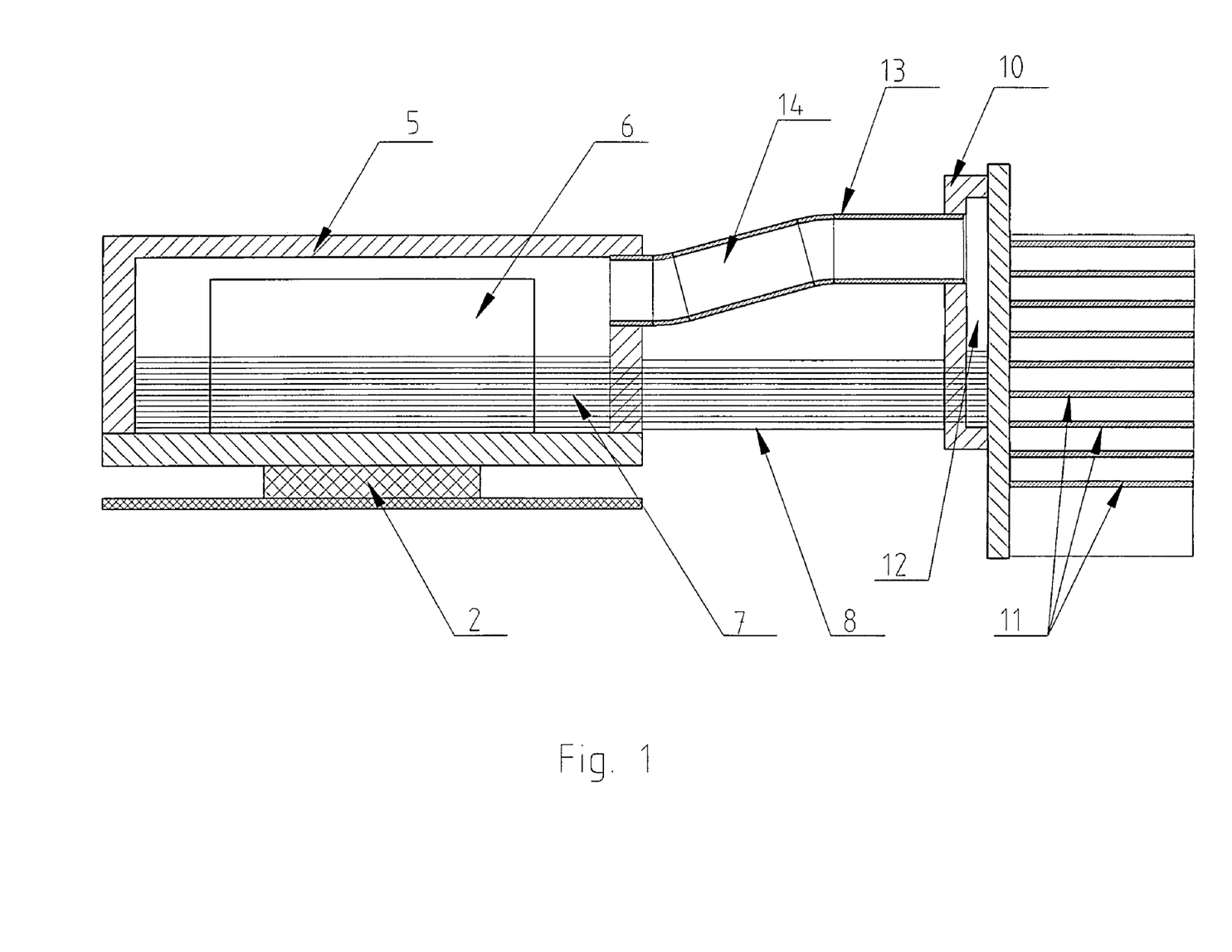
FIG. 1 shows a cross-sectional view of a thermosyphon cooling device of the present invention.

FIG. 1 shows a thermosyphon device comprising an evaporator 5 and a condenser 10 containing a liquid coolant 7. Evaporator 5 is connected to condenser 10 by coolant pipe 8 and vapor pipe 13. Coolant pipe 8 is a horizontal pipe attached at or near the bottom of both evaporator 5 and condenser 10. The coolant pipe 8 is at or below the level of liquid coolant 7 and is filled, completely or incompletely, with liquid coolant 7. Vapor pipe 13 is placed above the level of liquid coolant 7 at a slight angle and attaches to or near the top of evaporator 5 and condenser 10. In FIG. 1, only one coolant pipe 8 and vapor pipe 13 are illustrated, however, multiple pipes can also be used.

The bottom of evaporator 5 contacts heat source 2, which is typically a CPU. A plurality of evaporator fins 6 extends from the bottom of the evaporator to above the surface of the liquid coolant 7. The distance between individual evaporator fins 6 and between the evaporator fins 6 and the sides of the evaporator 5 is sufficient to prevent bubbles formed on different evaporator 6 fins and on the sides from merging before detaching from the evaporator fins 6 and sides.

Condenser 10 is a long chamber having a narrow interior channel 12. The level of liquid coolant 7 in condenser 10 is high enough to allow some amount of liquid coolant 7 to flow through coolant pipe 8 into evaporator 5 to support the rate of evaporation and/or boiling. A plurality of cooling fins 11 is attached to the outer wall of condenser 10.

When in use, heat generated by heat source 2 is transferred through the bottom of evaporator 5 and evaporator fins 6 to liquid coolant 7, causing liquid coolant 7 to boil or evaporate. The vapor 14 created by the boiling and/or evaporation of liquid coolant 7 leaves the evaporator 5 through vapor pipe 13 and enters the channel 12 of condenser 10. Airflow past cooling fins 11, typically provided by a fan or blower (not shown), lowers the temperature of the inner walls of the condenser 10 causing the vapor 14 to condense into the bottom of the channel 12. Liquid coolant 7 at the bottom of condenser 10 travels through coolant pipe 8 back into evaporator 5.

Figure 2:
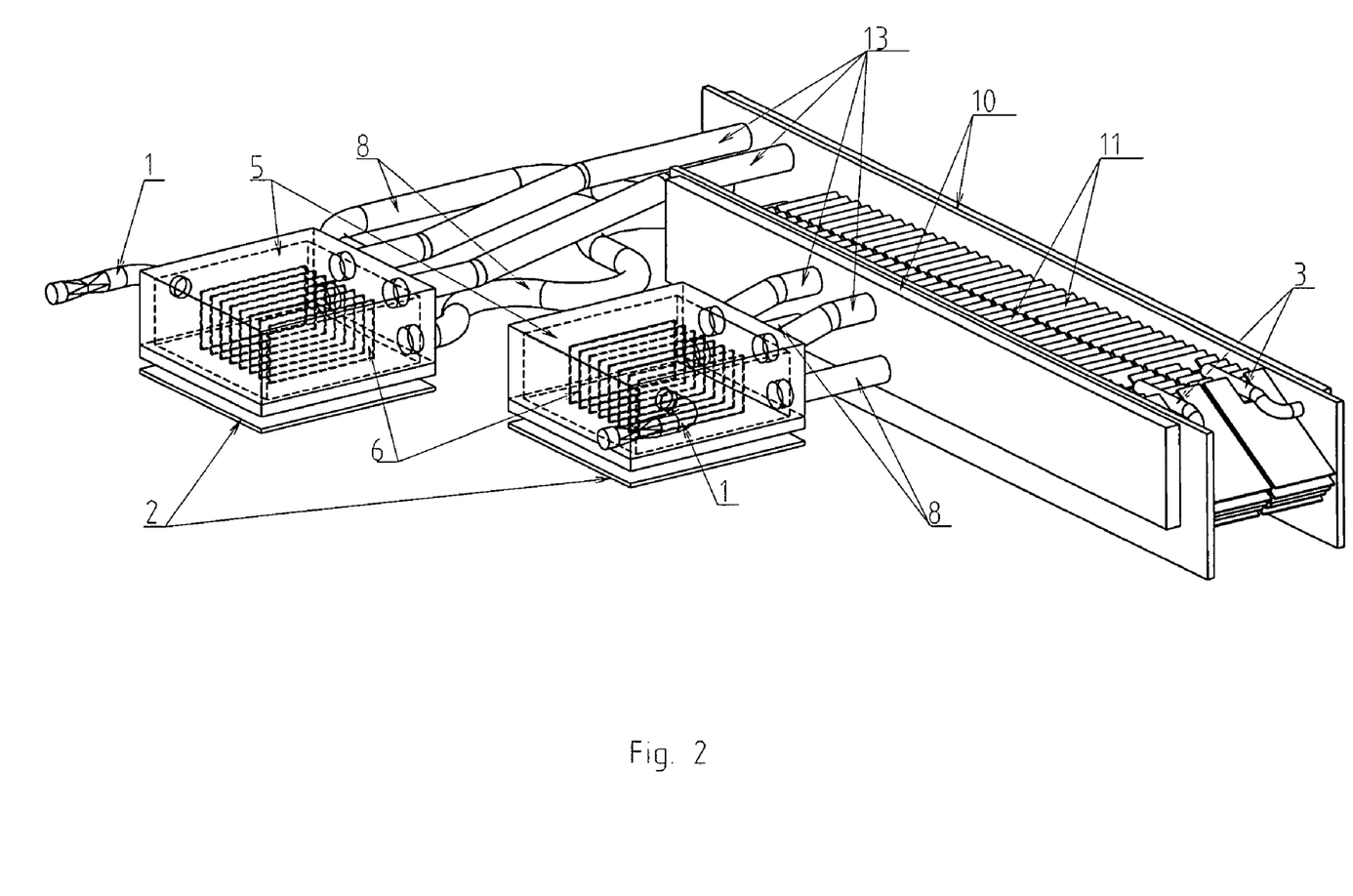
FIG. 2 shows a perspective view of a cooling system of the present invention comprising two thermosyphon devices where the cooling fins are attached to the sides of the condensers that face each other.
Figure 3:
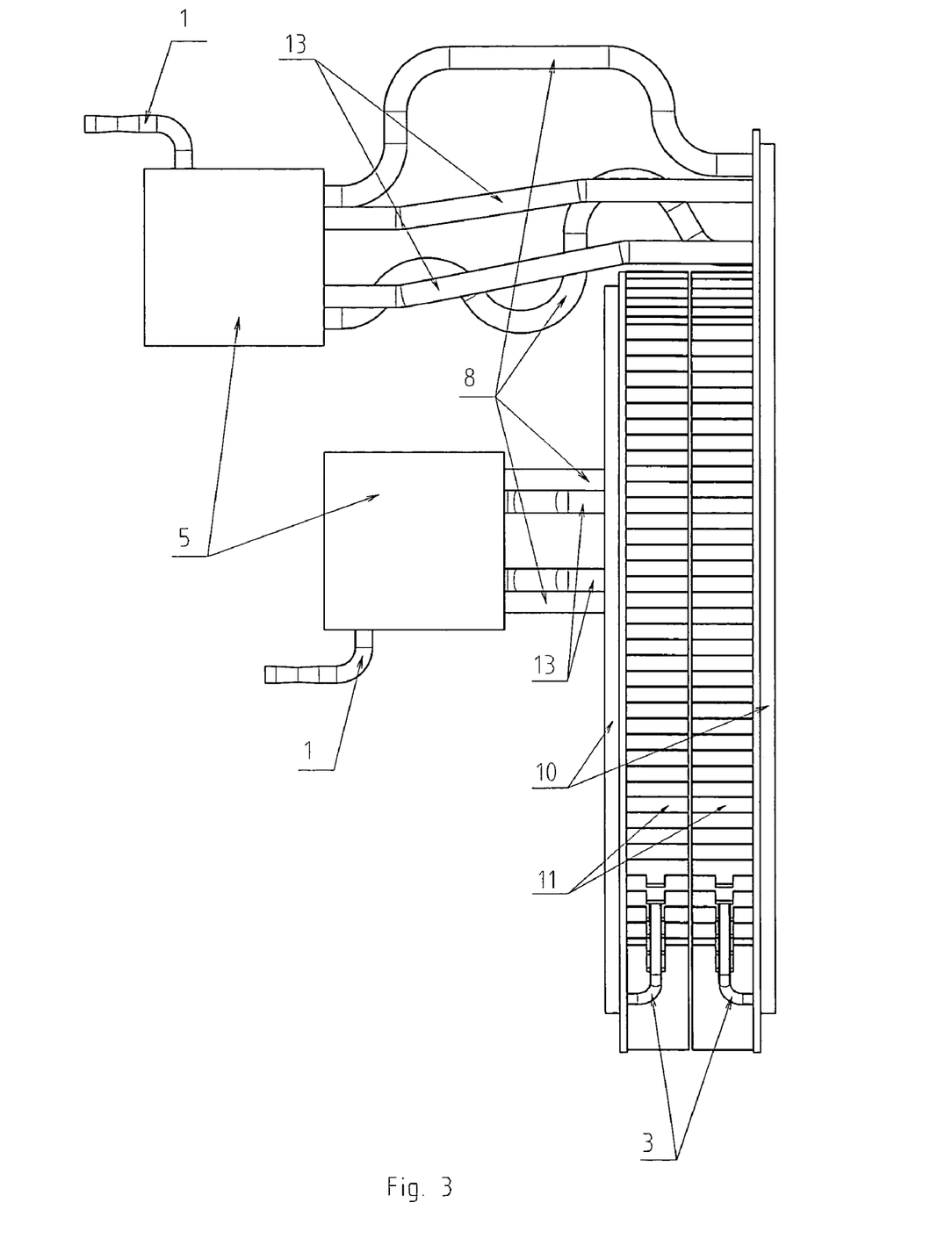
FIG. 3 shows a top view of the cooling system shown in FIG. 2.
Figure 4A:
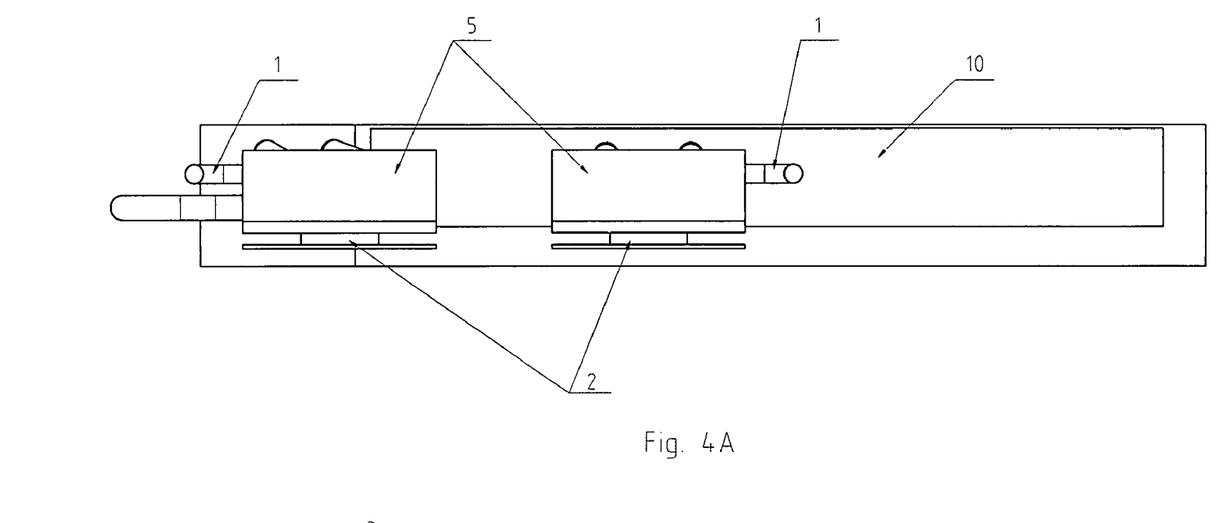
FIG. 4A shows a side view of the cooling system shown in FIG. 2.
Figure 4B:
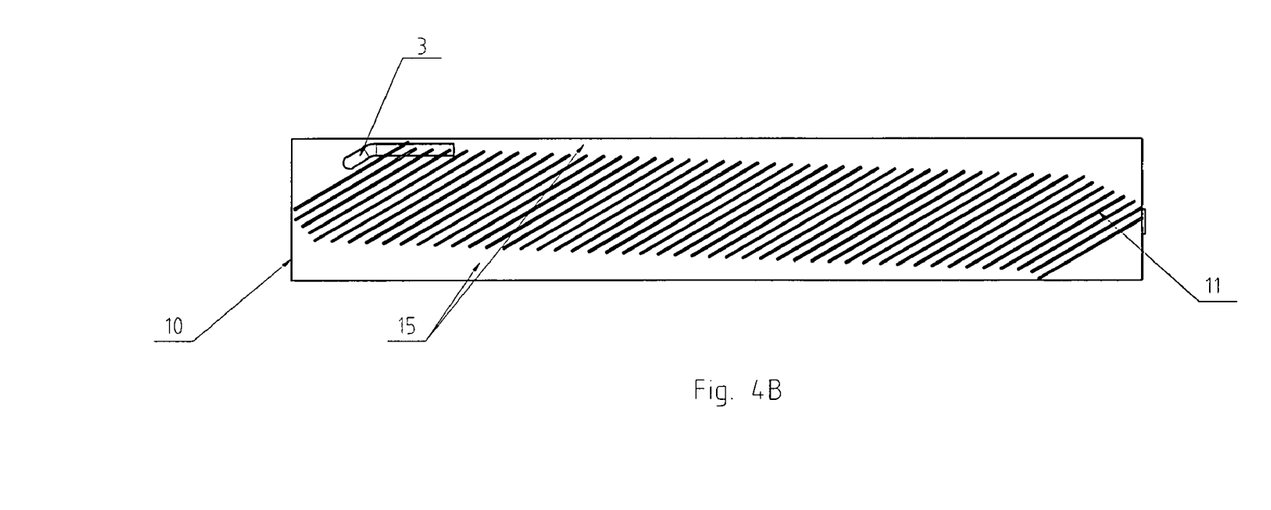
FIG. 4B shows a side view of a condenser of the present invention having a plurality of angled cooling fins.

In one embodiment of the present invention, as illustrated in FIGS. 2, 3 and 4B, the cooling fins 11 are placed at an angle between horizontal and vertical and are attached to one of the long sides of the condenser 10. FIGS. 2 and 3 show one embodiment where two thermosyphons having multiple cooling pipes 8 and vapor pipes 13 are used side by side in cooling systems where there are two heat sources 2. The coolant pipes 8 and vapor pipes 13 attach to the condensers 10 either near the end of the condenser 10 or near the middle of condenser 10. The two thermosyphon devices are orientated so that the sides of the condensers 10 having the attached cooling fins 11 face each other. A fan or blower (not shown) will horizontally blow air between the condensers 10 through the cooling fins 11.

In one embodiment, the thermosyphon device includes a safety valve 3 as illustrated in FIGS. 2, 3 and 4B. A safety valve is a pipe, in this embodiment a copper pipe approximately $1/8^{th}$ of an inch in diameter, having one end attached to the interior upper portion of condenser 10 and a free end pointing between the two condensers 10 or in some direction with sufficient air space.

The free end of the safety valve 3 is sealed with a solder that melts at a temperature above the working range of the device but below the temperature where the thermosyphon device can be destroyed by pressure of the vapor or by melting of the solder used for joining the parts of the thermosyphon, thus causing additional damage to computer system or electronic device, or the rack, enclosure and other objects. In case of fire, when the temperature reaches the melting point of the safety valve's solder, the safety valve 3 opens, vapor pushes out the solder and escapes the device. If the coolant is flammable, it will burn outside of the thermosyphon in the space within the case that is already heated by the fire. This space is between the two condensers 10 or can be between the condenser 10 and the outer wall of the case (not shown). This space does not contain flammable materials and the total amount of coolant within the thermosyphon device is small, approximately 20 milliliters per CPU in one embodiment. The burning coolant will therefore be contained within this space and does not significantly contribute to the fire, or cause an explosion in a worse case scenario. The safety valve 3 does not perform any function during normal operation of the thermosyphon device and is only triggered at the point where the CPUs, motherboard, power circuits and other vital parts of the computer are damaged by high temperatures.

A filling pipe 1, illustrated in FIGS. 2, 3 and 4A, is a copper pipe approximately $3/16^{th}$ of an inch in diameter attached to the interior of evaporator 5. To fill the cooling device with coolant, a filling machine (not shown) attaches to the filling pipe 1 using a compression fitting or similar device. The filling machine first removes the air from the cooling device and then fills it with the appropriate amount of coolant. After coolant has been added, the filling pipe 1 is crimped, the cooling device is removed from the filling machine, and the filling pipe 1 is sealed.

If sealing is done through soldering or welding, the cooling system may be placed in a water tank to keep the temperature and pressure of the coolant inside the system low while high temperature is applied to the end of the filling pipe. The filling pipe may be bent before or after filling to reduce the footprint of the device while keeping a sufficient distance between the evaporator and crimping/sealing point. Alternatively, the filling pipe may be attached to other components of the cooling device, such as the condenser, pipes, or the safety valve. Additionally, in some embodiments, the safety valve may be used as the filling pipe.

FIG. 4B shows a side view of angled cooling fins 11 attached to condenser 10. Wedge-shaped areas 15 are spaces along the side of the condenser 10 where there are no cooling fins 11. The wedge-shaped areas 15 are formed by the cooling fins 11 placed to form a uniform structure, or the cooling fins 11 are placed in multiple groups forming steps (not shown). The wedge-shaped areas 15 allow air to enter and exit through the cooling fins 11 at multiple areas along the condenser 10, thus creating more even temperature distribution.

Figure 5A:
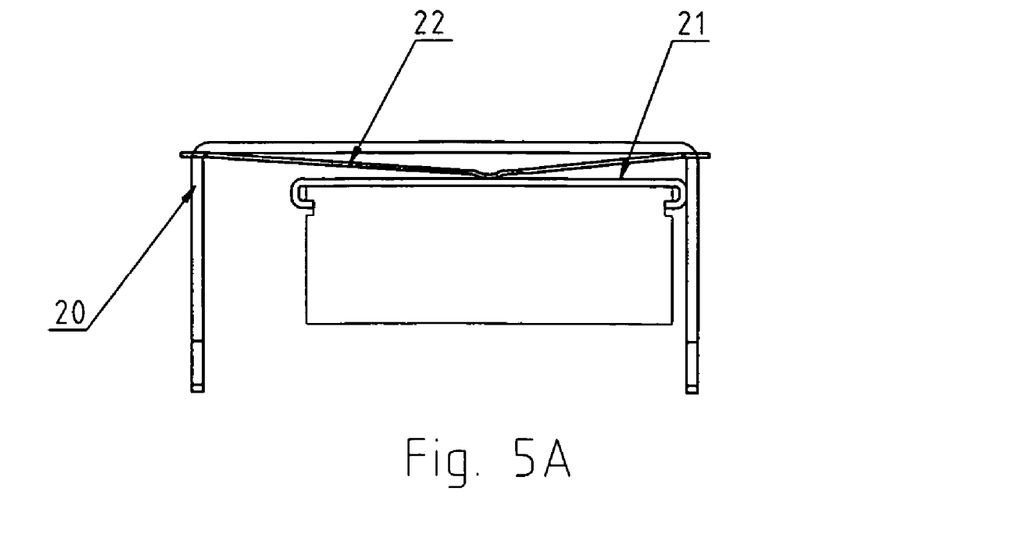
FIG. 5A shows a side view of a bracket and S-shaped spring used to clamp an evaporator of the present invention to the heat source.
Figure 5B:
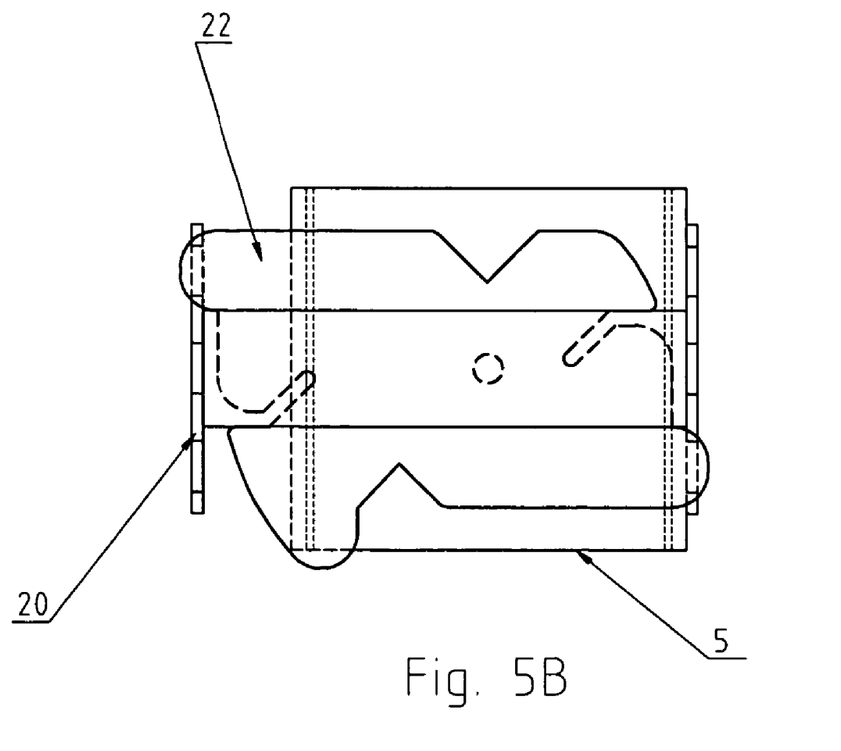
FIG. 5B shows the top view of the bracket and S-shaped spring.

In one embodiment of the present invention, as shown in FIGS. 5A and 5B, an evaporator bracket 20 and S-shaped spring 22 clamp the evaporator 5 to the heat source 2 (not shown). Optionally, an evaporator cover 21 (shown in FIG. 5A) is placed on top of the evaporator 5. The S-shaped spring 22 is placed on top of the evaporator cover 21 or evaporator 5, if a cover is not used, so that it contacts the evaporator cover 21 or evaporator 5 in the center directly above the center of the heat source 2 (not shown). The evaporator bracket 20 fits over the evaporator 5 leaving a small space above the top of the evaporator 5 for the S-shaped spring 22 and the evaporator cover 21. One end of the evaporator bracket 20 is positioned so that the vertical side of the bracket 20 is close to the side of the evaporator 5, while the other end of the bracket 20 extends further out creating a space between the bracket 20 and the side of the evaporator 5. The S-shaped spring 22 is rotated and bends until it latches with the bracket 20, keeping the device secure. To remove the evaporator 5, the ends of the S-shaped spring 22 are pressed, releasing the latched ends, and the S-shaped spring 22 is rotated back until it releases the bracket 20.

Figure 6:
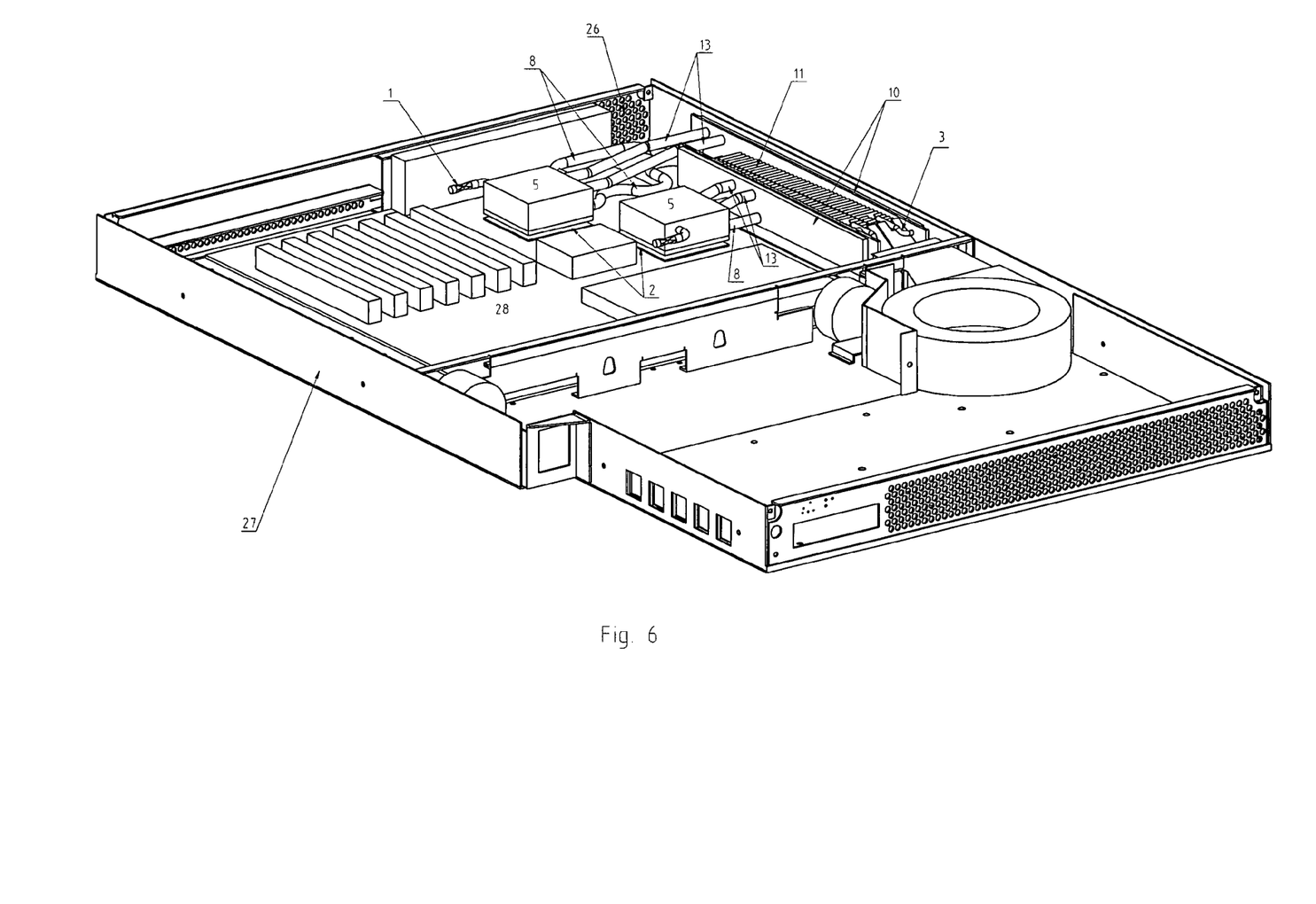
FIG. 6 illustrates a cooling system of the present invention comprising two thermosyphon devices placed in a computer case.

FIG. 6 illustrates two thermosyphon devices configured as illustrated in FIGS. 2 and 3 and placed within a computer case 27. Evaporators 5 are placed on heat sources 2 contained on a circuit board 28. Condensers 10 are connected to evaporators 5 through coolant pipes 8 and vapor pipes 13. The sides of the condensers 10 having attached cooling fins 11 are orientated to face each other. The cooling fins 11 are placed at an angle between horizontal and vertical. Air traveling past condensers 10 and cooling fins 11 exit through a vent 26 at the end of case 27.

In one embodiment of the present invention, the computer case housing the cooling system is 17 inches wide, 1.73 inches high, and 27 inches long. A standard Extended ATX motherboard format that is commonly used for high-end boards in servers is a circuit board that measures 12 inches by 13 inches. The closed compartments of the case contain a power supply, hard drives, fans and various connectors. In one embodiment, two Athlon CPUs are cooled with two thermosyphon devices. The airflow that cools the condensers is passed from the compartment containing the power supply and fans through the condenser fins to the grille at the back of the case.

While the invention has been described with certain preferred embodiments, it is understood that the preceding description is not intended to limit the scope of the invention. It will be appreciated by one skilled in the art that various equivalents and modifications can be made to the invention shown in the specific embodiments without departing from the spirit and scope of the invention. All publications referred to herein are incorporated herein to the extent not inconsistent herewith.

We claim:

1. A thermosyphon cooling device comprising:
   (a) an evaporator having a length between about 0.75 inches and about 2.0 inches, a width between about 0.75 inches and about 2.0 inches, and a height between about 0.5 inches and about 1.0 inches;

(b) a narrow condenser having a length between about 5.0 inches and about 13.0 inches, a width between about 0.2 inches and about 0.5 inches, and a height between about 1.0 inches and about 1.7 inches;

(c) a liquid coolant within said evaporator and condenser;

(d) at least one coolant pipe connecting said evaporator to said condenser, wherein said at least one coolant pipe is at or below the level of said liquid coolant; and (e) at least one vapor pipe connecting said evaporator with said condenser, wherein said at least one vapor pipe is above the level of said liquid coolant.

2. The device of claim 1 further comprising a plurality of cooling fins attached to at least one side of said condenser and extending laterally from said condenser.

3. The device of claim 2 wherein said plurality of cooling fins are orientated at an angle between horizontal and vertical.

4. The device of claim 1 wherein said evaporator is attached to the top of a heat source.

5. The device of claim 4 wherein said heat source is a CPU.

6. The device of claim 1 further comprising one or more vertical evaporator fins within said evaporator, wherein said one or more evaporator fins are attached to the bottom of said evaporator and extend to or above the surface of said liquid coolant.

7. The device of claim 1 wherein said liquid coolant is acetone, ethanol, methanol or water.

8. The device of claim 1 wherein said device is made from copper, brass, aluminum, or a combination thereof.

9. The device of claim 1 wherein the height of said device is about 2.0 inches or less.

10. A computer system comprising:

(a) a computer case, wherein said case has a width of about 17 inches or less, a height of 1.75 inches or less, and length of 28 inches or less;

(b) at least one heat source within said computer case; and (c) at least one thermosyphon device within said computer case, said thermosyphon device comprising:

(i) an evaporator having a length between about 0.75 inches and about 2.0 inches, a width between about 0.75 inches and about 2.0 inches, and a height between about 0.5 inches and about 1.0 inches;

(ii) a narrow condenser having a length between about 5.0 inches and about 13.0 inches, a width between about 0.2 inches and about 0.5 inches, and a height between about 1.0 inches and about 1.7 inches;

(iii) a liquid coolant within said evaporator and condenser;

(iv) at least one coolant pipe connecting said evaporator to said condenser, wherein said at least one coolant pipe is at or below the level of said liquid coolant; and (v) at least one varpor pipe connecting said evaporator with said condenser, wherein said at least one varpor pipe is above the level of said liquid coolant.

11. The computer system of claim 10 wherein said at least one thermosyphon device comprises one or more vertical evaporator fins within said evaporator, wherein said one or more evaporator fins are attached to the bottom of said evaporator and extend to or above the surface of said liquid coolant.

12. The computer system of claim 10 wherein said at least one thermosyphon device comprises a plurality of cooling fins attached to at least one side of said condenser and extending laterally from said condenser.

13. The computer system of claim 12 further comprising a fan or air blower suitable for causing airflow through said cooling fins.

14. The computer system of claim 10 comprising two thermosyphon devices within said case.

15. The computer system of claim 14 wherein said two thermosyphon devices comprises a plurality of cooling fins attached to at least one side of each condenser.

16. The computer system of claim 10 wherein said at least one heat source is a CPU.

17. The computer system of claim 10 wherein said evaporator is between about 1.8 and about 2.0 inches wide, between about 1.8 and about 2.0 inches long, and between about 0.7 and 0.8 inches tall.

18. The computer system of claim 10 wherein said condenser is between about 8.0 and about 10.0 inches long, between about 0.2 and about 0.25 inches wide, and between about 1.4 and about 1.5 inches tall.

19. The computer system of claim 18 wherein said evaporator is about 1.97 inches long, 1.97 inches wide and 0.75 inches high, and said condenser is about 0.24 inches wide, about 9.84 inches long and 1.46 inches high.

20. The computer system of claim 13 further comprising an evaporator bracket attached to the bottom of said case and placed over said evaporator and said heat source, and a S-shaped spring placed between said heat source and said bracket, wherein said evaporator bracket and a S-shaped spring apply a downward force to the center of the evaporator.

* * * * *